United States Patent
Fernandes et al.

(10) Patent No.: US 10,665,663 B1
(45) Date of Patent: May 26, 2020

(54) IC WITH TOP SIDE CAPACITOR HAVING LATERAL REGIONS WITH THINNED CAPACITOR DIELECTRIC

(71) Applicant: Texas Instruments Incorporated, Dallas, TX (US)

(72) Inventors: Poornika Fernandes, Murphy, TX (US); Bhaskar Srinivasan, Allen, TX (US); Guruvayurappan Mathur, Plano, TX (US); Abbas Ali, Plano, TX (US); David Matthew Curran, Plano, TX (US); Neil L. Gardner, Lowry Crossing, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/198,527

(22) Filed: Nov. 21, 2018

(51) Int. Cl.
| | |
|---|---|
| *H01L 29/00* | (2006.01) |
| *H01L 49/02* | (2006.01) |
| *H01L 27/06* | (2006.01) |
| *H01L 21/02* | (2006.01) |
| *H01L 21/762* | (2006.01) |
| *H01L 21/285* | (2006.01) |
| *H01L 21/3213* | (2006.01) |

(52) U.S. Cl.
CPC .......... *H01L 28/60* (2013.01); *H01L 21/0214* (2013.01); *H01L 21/0217* (2013.01); *H01L 21/02164* (2013.01); *H01L 21/02274* (2013.01); *H01L 21/28518* (2013.01); *H01L 21/32133* (2013.01); *H01L 21/76202* (2013.01); *H01L 21/76224* (2013.01); *H01L 27/0629* (2013.01)

(58) Field of Classification Search
CPC .......... H01L 28/40; H01L 2924/13091; H01L 27/10852; H01L 23/5222; H01L 27/1255; H01L 21/02194; H01L 21/02107; H01L 21/02332; H01L 21/02112; H01L 21/02164; H01L 21/02175; H01L 21/32139; H01L 2924/30105
USPC ........................................................ 257/532
See application file for complete search history.

(56) References Cited

U.S. PATENT DOCUMENTS

| | | | |
|---|---|---|---|
| 5,065,220 A | 11/1991 | Paterson et al. | |
| 5,576,240 A * | 11/1996 | Radosevich | ............ H01L 28/40 438/396 |
| 7,535,079 B2 * | 5/2009 | Remmel | ............. H01L 23/5223 257/532 |

* cited by examiner

*Primary Examiner* — Theresa T Doan
(74) *Attorney, Agent, or Firm* — Andrew R. Ralston; Charles A. Brill; Frank D. Cimino (57) ABSTRACT

An integrated circuit (IC) includes a semiconductor surface layer on a substrate including functional circuitry having circuit elements configured together with a metal-to-polysilicon capacitor on the semiconductor surface layer for realizing at least one circuit function. The metal-to-polysilicon capacitor includes a bottom plate including polysilicon, a capacitor dielectric including at least one capacitor dielectric layer on the bottom plate, a top plate on the capacitor dielectric, and contacts through a pre-metal dielectric layer that contact the top plate and contact the bottom plate. In lateral regions relative to the capacitor the capacitor dielectric layer has a thickness in a range between about 5% and about 50% of a thickness of the capacitor dielectric of the metal-to-polysilicon capacitor.

20 Claims, 7 Drawing Sheets

IC WITH TOP SIDE CAPACITOR HAVING LATERAL REGIONS WITH THINNED CAPACITOR DIELECTRIC

FIELD

This Disclosure relates to integrated circuit (IC) devices, and more particularly but not exclusively to IC devices having metal-to-polysilicon capacitors.

BACKGROUND

Advanced analog and radio frequency (RF) ICs generally include at least one precision metal-to-polysilicon capacitor located above the semiconductor surface, such as for a complementary metal-oxide-semiconductor (CMOS) IC. A metal-to-polysilicon capacitor is formed between the polysilicon gate level and the metal 1 (M1) level.

Advanced analog circuit applications may need precision capacitors which have voltage nonlinearity of less than +1 part per million (ppm) and a capacitance density larger than 1 fF/$\mu$m$^2$. In the integration of metal-to-polysilicon capacitors the capacitor dielectric layer (or dielectric layers) generally remain over the entire die area.

SUMMARY

This Summary is provided to introduce a brief selection of disclosed concepts in a simplified form that are further described below in the Detailed Description including the drawings provided. This Summary is not intended to limit the claimed subject matter's scope.

The Disclosure includes an IC comprising a semiconductor surface layer on a substrate including functional circuitry having circuit elements configured together with a metal-to-polysilicon capacitor on the semiconductor surface layer for realizing at least one circuit function. The metal-to-polysilicon capacitor includes a bottom plate including polysilicon, a capacitor dielectric on the bottom plate, a top plate on the capacitor dielectric, and contacts through a pre-metal dielectric (PMD) layer including a contact that contacts the top plate and a contact that contacts the bottom plate. A hard mask (HM) layer is generally on the top plate. In lateral regions relative to the capacitor the capacitor dielectric layer is thinned relative to a thickness of the capacitor dielectric of the metal-to-polysilicon capacitor. At least a portion of an outer edge of the capacitor dielectric is undercut relative to an outer edge of the HM layer.

BRIEF DESCRIPTION OF THE DRAWINGS

Reference will now be made to the accompanying drawings, which are not necessarily drawn to scale, wherein.

DETAILED DESCRIPTION

Disclosed examples are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

This Disclosure recognizes for metal-to-polysilicon capacitor integration, where the capacitor dielectric comprising at least one capacitor dielectric layer layer(s) remains as a blanket layer over the entire IC die, a lower voltage threshold ($V_T$) may result for the parasitic field oxide transistors and increased noise for the IC components which comprise transistors, such as when the transistor are configured as an analog IC. In order for the metal-to-polysilicon capacitors to be independently integrated with the front end of the line (FEOL) circuitry, in the case the capacitor dielectric includes a charge trapping layer such as silicon nitride (SiN), silicon oxynitride (SiON), or plasma etch damaged silicon oxide, the capacitor dielectric needs to be at least primarily etched away lateral to the metal-to-polysilicon capacitor to avoid the parasitic field oxide transistors from turning on or causing leakage during IC operation.

This Disclosure includes methods that may be advantageously employed to partially etch away the capacitor dielectric layer(s) used by the metal-to-polysilicon capacitor lateral to the capacitor, including generally removing at least most of the charge trapping layer in a manner that does not impact the FEOL circuitry and/or allows the contact etch to land on the active area including on the bottom plate and on the top plate, and to contact nodes in the IC circuitry. The metal-to-polysilicon capacitor is generally formed on a field oxidation, such as on shallow trench isolation (STI) or LOCal Oxidation of Silicon (LOCOS).

Figure 1:
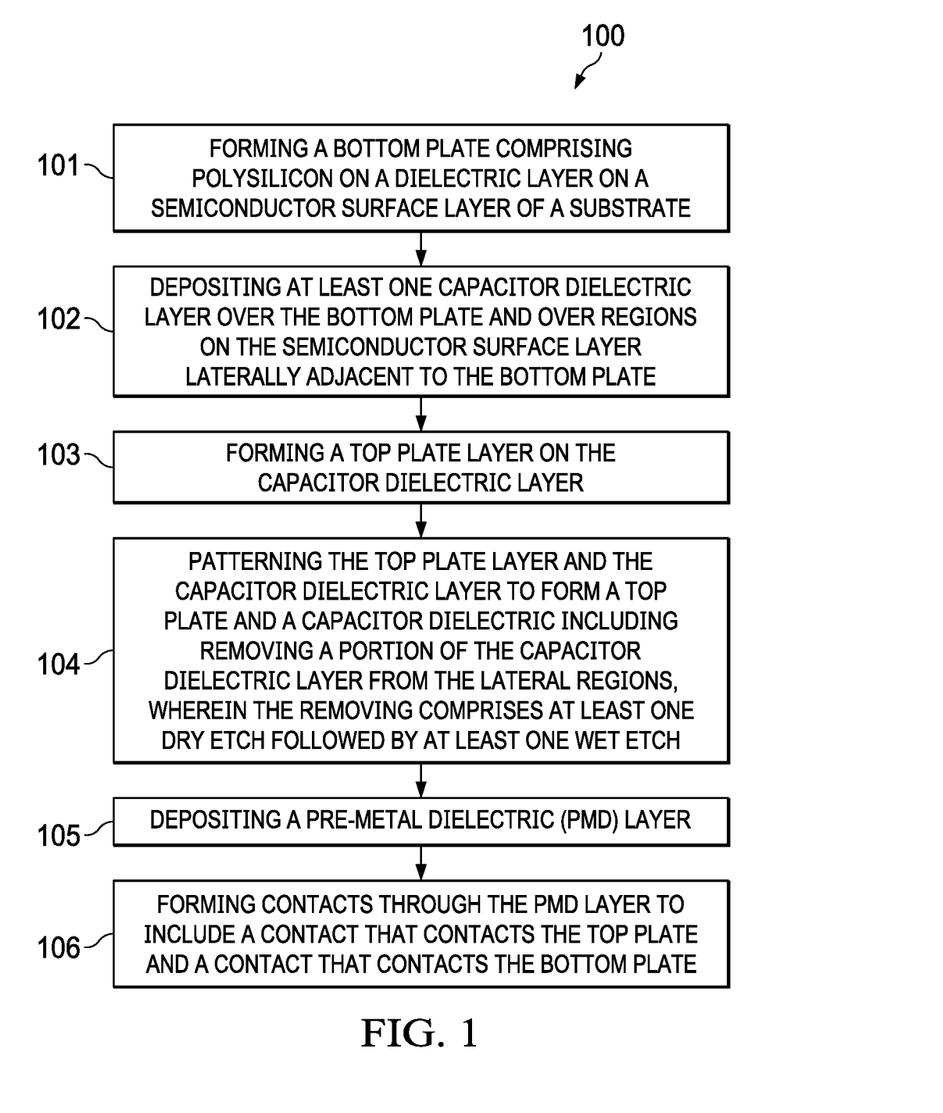
FIG. 1 is a flow chart that shows steps in an example method of fabricating ICs including at least one metal-to-polysilicon capacitor, where there is a thinned capacitor dielectric layer in lateral regions relative to the capacitor dielectric of the capacitor, according to a disclosed example.
Figure 2A:
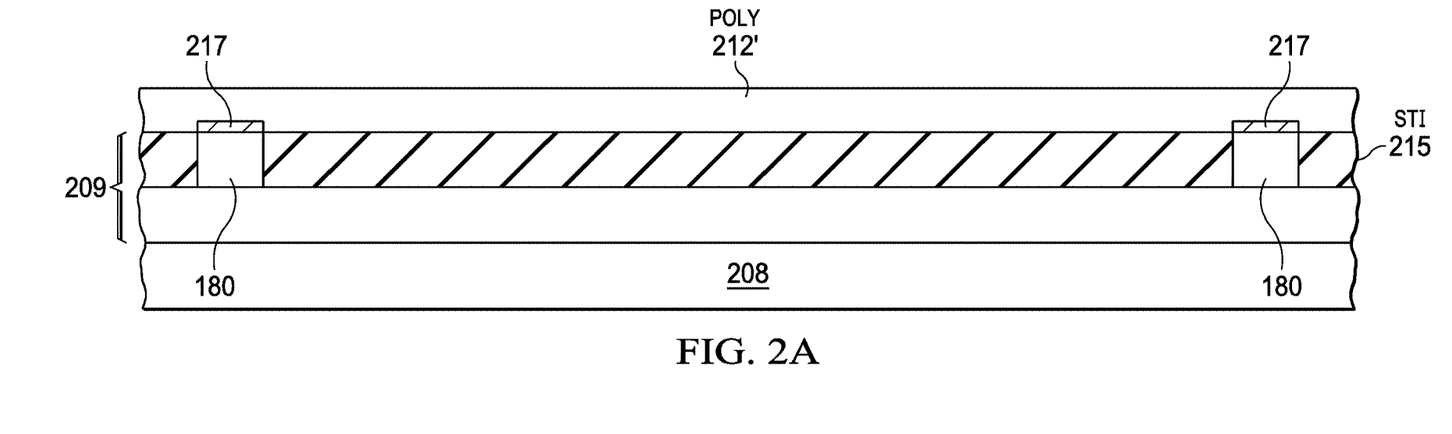
FIGS. 2A-G show successive cross sectional depictions for forming an example metal-to-polysilicon capacitor on an IC, where there is a thinned capacitor dielectric layer in the lateral regions relative to the capacitor dielectric of the capacitor, according to a disclosed example.

FIG. 1 is a flow chart that shows steps in an example method 100 of fabricating a metal-to-polysilicon capacitor on an IC, where there is a thinned capacitor dielectric layer in lateral regions relative to the thickness of the capacitor dielectric for the metal-to-polysilicon capacitor. The thinned capacitor dielectric layer generally has a thickness in a range between about 5% and about 50% of the thickness of the capacitor dielectric for the metal-to-polysilicon capacitor. FIG. 2A shows the in-process result after starting with a semiconductor surface layer 209 on a substrate 208 (e.g., a wafer) with a field dielectric in a portion of the semiconductor surface layer 209 shown by example as STI 215, with active areas being between the STI 215 with a gate dielectric layer 217 between STI regions (not shown) in the functional circuitry 180, then depositing a blanket polysilicon layer 212' shown a 'poly' 212'. As noted above the field dielectric can also be a LOCOS oxide.

The functional circuitry 180 comprises circuit elements (including transistors, and generally diodes, resistors, capacitors, etc.) formed in the semiconductor surface layer 209 that generally includes metal oxide semiconductor (MOS) devices having gate electrodes using the same polysilicon layer as the metal-to-polysilicon capacitor that will be configured together with the metal-to-polysilicon capacitor(s) for realizing at least one circuit function. Example circuit functions include analog (e.g., amplifier or power converter), radio frequency (RF), digital, or non-volatile memory functions.

The plates of the metal-to-polysilicon capacitor will generally be coupled to nodes in the functional circuitry 180. Example circuit functions include analog (e.g., amplifier or power converter), radio frequency (RF), digital, or non-volatile memory functions. The substrate 208 and/or semiconductor surface layer 209 can comprise silicon, silicon-germanium, or another semiconductor material. The capability of functional circuitry provided on a disclosed IC may vary, for example ranging from a simple device to a complex device. The specific functionality contained within functional circuitry is not of importance to disclosed ICs. The functional circuitry is generally formed in the substrate before forming the metal-to-polysilicon capacitor(s).

Figure 2B:
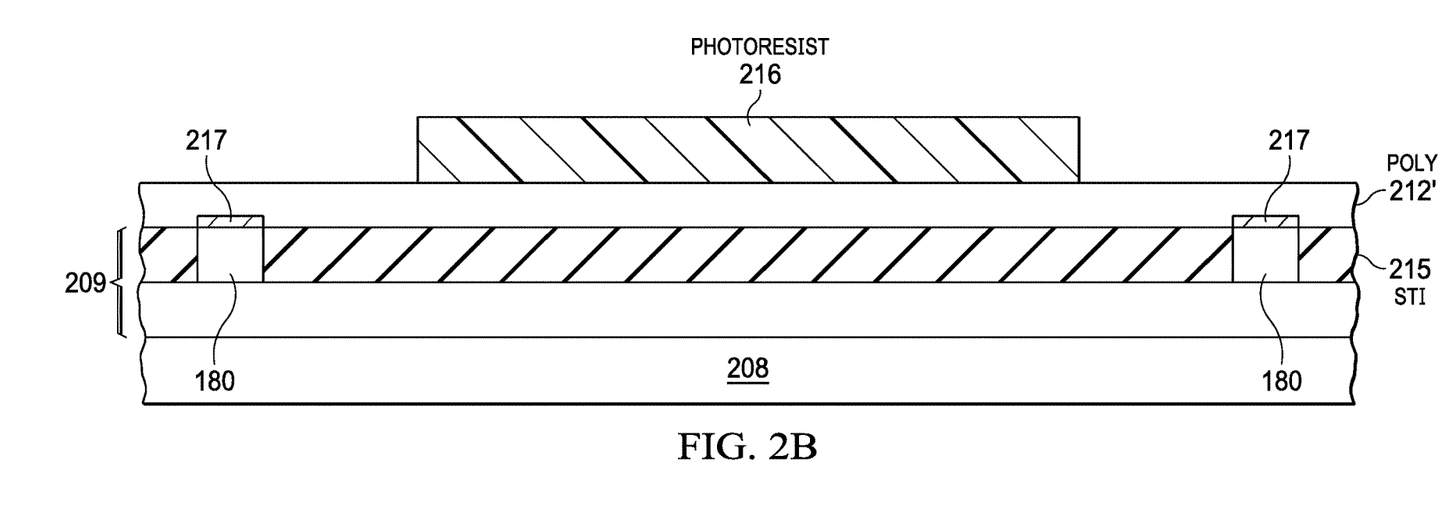
Figure 2C:
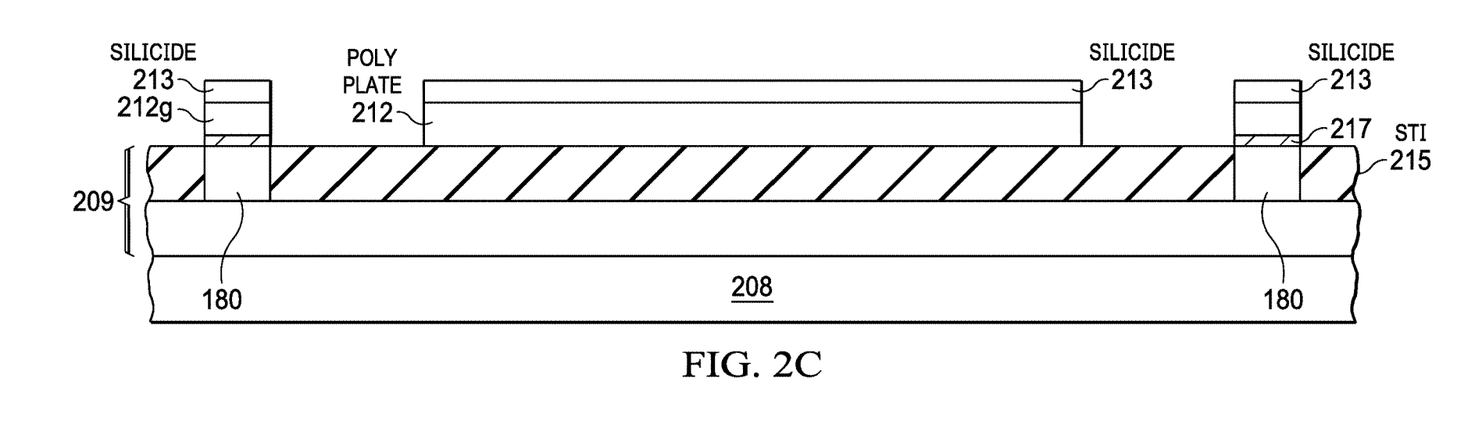

Step 101 comprises forming a bottom plate for the capacitor comprising patterning the polysilicon layer 212' (shown as "poly") over the STI 215, then generally siliciding the patterned polysilicon regions including for the capacitor to form a bottom plate 213/212 that comprises a silicide layer 213 on a polysilicon plate 212. The polysilicon layer 212' may be deposited with in-situ doping. FIG. 2B shows a pattern of photoresist 216 on the polysilicon layer 212' over the capacitor area of the die. FIG. 2C shows the in-process result after etching to pattern the polysilicon layer 212' to form the polysilicon plate 212 (shown as a poly plate), and then siliciding including to form the silicide layer 213 on the polysilicon plate 212 in the capacitor area, and to provide a silicide layer 213 for the functional circuitry 180 on the polysilicon gates shown for simplicity collectively as 212g on the gate dielectric layer 217.

Step 102 comprises depositing at least one capacitor dielectric layer 222 including over the bottom plate 213/212 and over lateral regions relative to the bottom plate 213/212 including over the functional circuitry 180 on the semiconductor surface layer 209. The capacitor dielectric layer can comprise a dielectric stack with two or more dielectric layers, such as comprising a first (bottom) silicon oxide layer, a middle SiN or SiON layer, and a second (top) silicon oxide layer, wherein the depositing the SiN or SiON layer can comprise low pressure chemical vapor deposition (LP-CVD) or plasma enhanced CVD (PECVD). The dielectric stack generally includes at least one charge trapping layer, such as SiN or SiON, or silicon oxide which can be a charge trapping layer as well resulting from a plasma etching process.

The capacitor dielectric layer(s) can comprise a high-k dielectric layer defined herein having a k-value (relative dielectric permittivity) of at least that of silicon nitride (k>6) so that its k-value is well above that of silicon oxide (k-value of 3.9). One capacitor dielectric stack comprises ONO (silicon oxide\silicon nitride\silicon oxide). The total thickness of the capacitor dielectric layer(s) is generally in a range between about 20 nm and about 200 nm. As used herein throughout, "about" refers to ±20%.

The nitride layer (e.g., SiN or SiON) in the capacitor dielectric stack can have a hydrogen concentration of ≤18 atomic %. This hydrogen concentration in the nitride layer is lower as compared to the hydrogen concentration in a conventional silicon nitride or silicon oxynitride layer that is generally 20 to 30 atomic %. It is recognized herein that a relatively low hydrogen content in the nitride layer in a capacitor dielectric stack provides improved voltage linearity for the metal-to-polysilicon capacitor including a low $|\beta|$ value and a low $|(\alpha)|$ value.

The deposition process to obtain a low hydrogen concentration nitride layer can comprise CVD such as LPCVD or PECVD, where the gases used include a nitrogen source comprising at least one nitrogen compound other than $N_2$ as well as $N_2$, and where a mass flow of the $N_2$ is at least 51% of a mass flow of the nitrogen source. For one particular example, PECVD silicon nitride may be deposited at a deposition temperature range of about 300° C. to about 500° C. with an $N_2$ mass flow rate in a range of about 3,000 sccm to about 10,000 sccm, a $NH_3$ mass flow rate of about 200 sccm to about 1,000 sccm, a $SiH_4$ mass flow rate of about 20 to about 200 sccm, at a pressure of about 2 Torr to about 6 Torr while applying RF-low frequency (LF) power and RF-high frequency (HF) power. The RF-LF power can be in a frequency range of about 50 kHz to about 500 kHz, for example, 400 kHz in a power range of 10 W to 200 W, and the RF-HF power can be in a frequency range of 10 MHz or more, for example, 13.65 MHz in a power range of 50 W to 400 W.

Figure 2D:
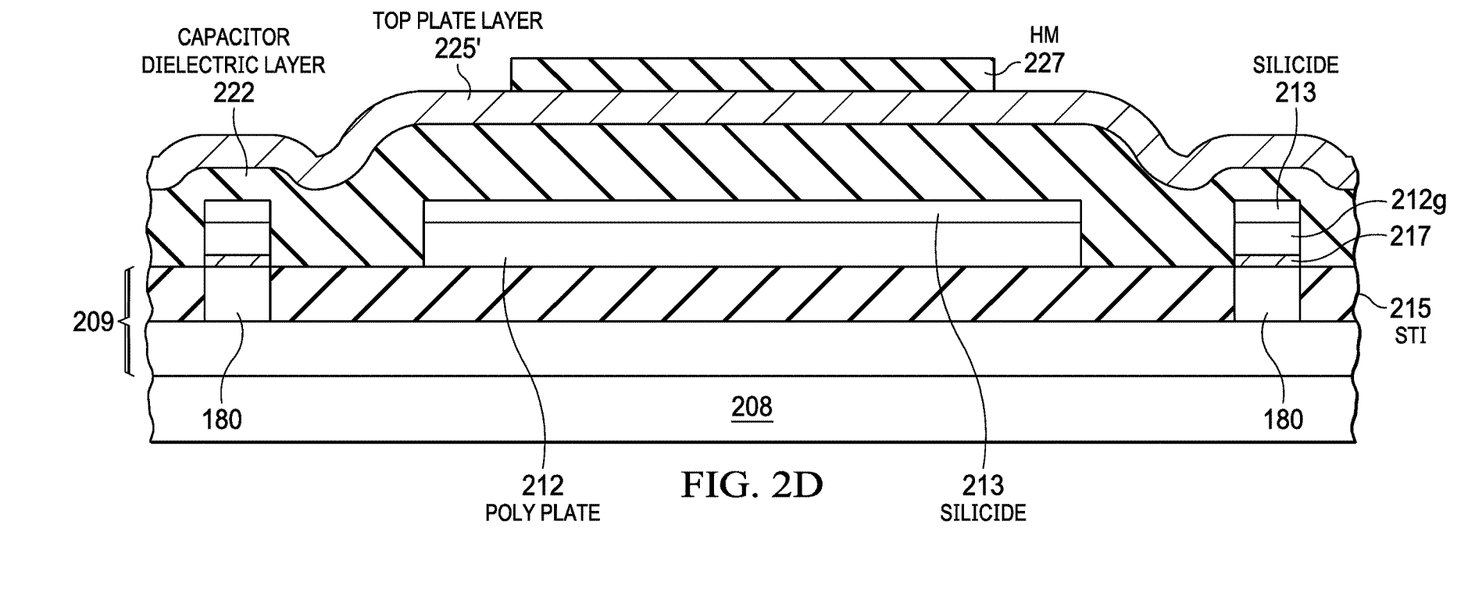

Step 103 comprises forming a top plate on the capacitor dielectric layer 222. FIG. 2D shows a patterned HM layer 227 on a top plate layer 225' over the capacitor dielectric layer 222. The top plate layer 225' can comprise TaN, TiN, Ni, Pt, Co, CoSi, or Ir. For some top plate materials such as TiN a HM layer 227 is generally formed on the top plate layer 225' before the patterning of the top plate layer 225', which is followed by patterning the capacitor dielectric layer 222. The HM layer 227 unlike most photoresist materials can adhere to the top plate layer 225' during a wet strip to enable the wet etching of the top plate layer 225' to form the top plate 225 for the capacitor which may include a standard clean 1 (SC1) wet strip, because most photoresist materials will generally not withstand a SC1 solution. A SC1 solution as known in the art comprises a $NH_4OH:H_2O_2:H_2O$ mixture.

Step 104 comprises patterning the top plate layer 225' (such as using the HM layer 227 shown) to form a top plate 225 using a top plate etch, and then patterning the capacitor dielectric layer 222 to form a capacitor dielectric 222b. The patterning the capacitor dielectric layer 222 includes removing a portion of the capacitor dielectric layer 222 from the lateral regions relative to the capacitor to form the lateral capacitor dielectric layer 222a shown that is thinner as compared to the thickness of the capacitor dielectric 222b.

Figure 2E:
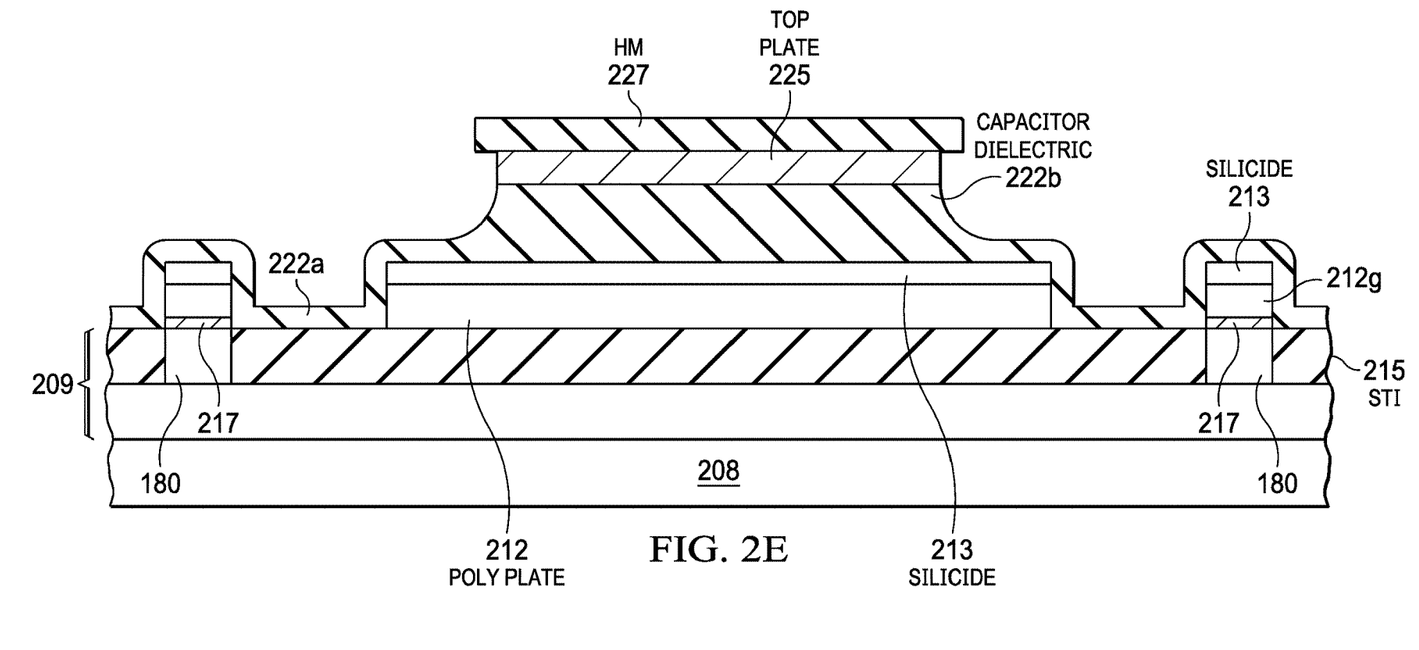

The capacitor dielectric layer 222 etch is generally performed with the HM layer 227 on the top plate 225 of the capacitor and comprises at least one dry etch followed by at least one wet etch. FIG. 2E shows the in-process IC after the patterning the top plate layer 225' to form the top plate 225 and the capacitor dielectric layer 222 in the lateral regions relative to the capacitor as the lateral capacitor dielectric layer 222a. The dry etch generally comprises a plasma etch. The wet etch is for removing more of the capacitor dielectric layer 222 without causing plasma damage resulting from plasma etching due to etch variation across the wafer during the dry etch. The top plate 225 is shown undercut relative to the HM layer 227 due to the wet etch of the top plate layer, and the capacitor dielectric 222b is also shown undercut relative to the HM layer 227 due to the wet etch portion of the etching of the capacitor dielectric layer 222.

In the case the capacitor dielectric 222b comprises an ONO dielectric stack, the etch of the capacitor dielectric layer 222 to form the capacitor dielectric 222b is performed to leave behind some of the bottom O of the ONO to help prevent plasma damage during the dry etch portion or HF damage during the wet etch portion to the silicide layer 213. This disclosed capacitor dielectric layer 222 etch allows independent integration of capacitor dielectric layer by featuring a dry etch and wet etch combination to remove most of the capacitor dielectric layer without undercutting the capacitor dielectric layer 222, which due to the isotropic nature of the wet etch if used for the entire etch of the capacitor dielectric layer 222 can lead to breakdown issues for the capacitor, and if all a dry etch can damage the silicide layer 213 and cause plasma damage to the capacitor dielectric 222b. For a metal-to-polysilicon capacitor developed with charge trapping dielectric film such as SiN, using a dry etch in combination with a subsequent wet etch can generally remove 50 to 95% of the as-deposited thickness of the dielectric stack, so that a thickness of the lateral capacitor dielectric layer 222a can be 5% to 50% of the thickness of the capacitor dielectric 222b.

For example, the dry etch can comprise a power of 150 W of RF power for 28 seconds using $BCl_3$ and $Cl_2$ as etch gases, and the wet etch can comprise a 4 nm wet etch (typically with HF). An example plasma etch uses a planar inductively coupled plasma source, and in one particular example uses etch gases $BCl_3$ and $Cl_2$ with a pressure of about 9 mtorr, an RF power to the planar coil of about 1 kW, bias RF power to the bias electrode of about 150 W, and an etch time of about 25 seconds. The wet etch step can target 4 nm of ONO without top plate undercut using about 120 seconds for a single-pass 0.5 wt % HF etch performed at room temperature.

Figure 2F:
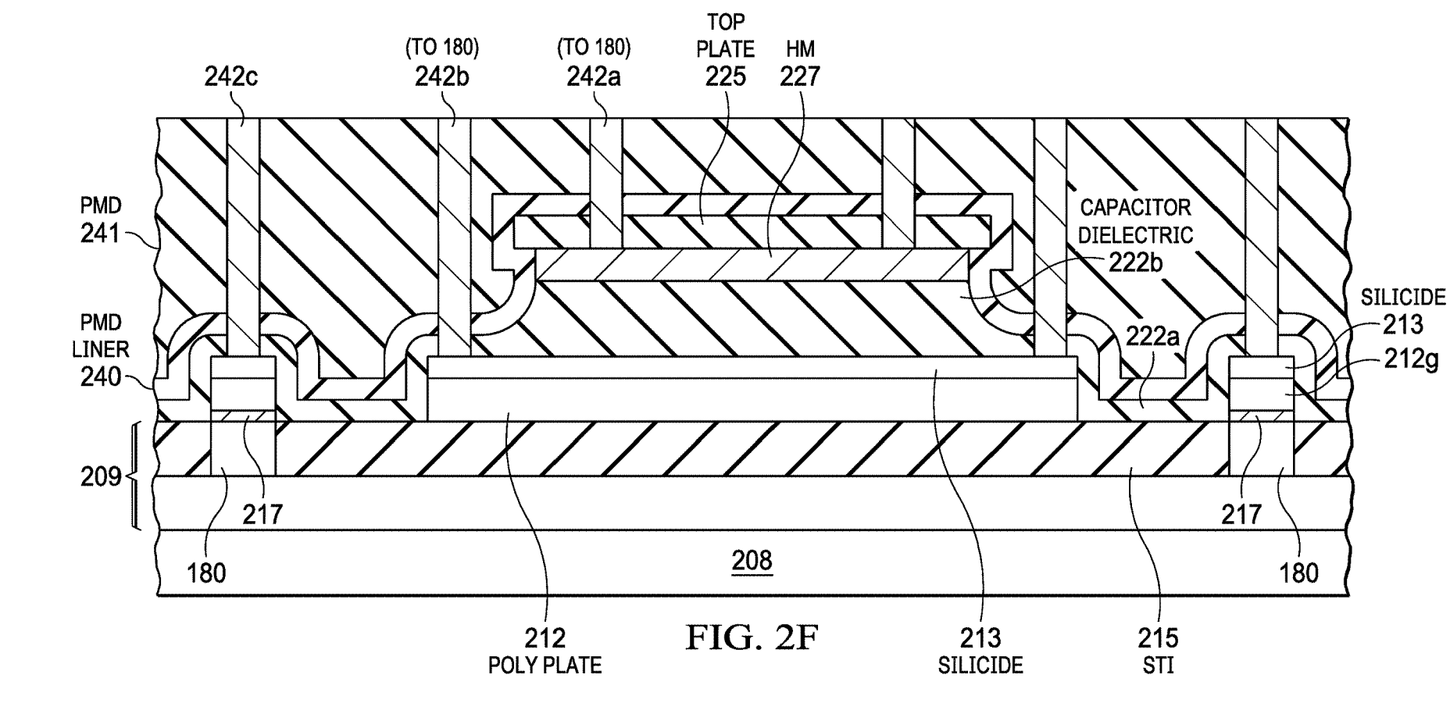

Step 105 comprises depositing a PMD layer 241 shown in FIG. 2F. FIG. 2F also shows a PMD liner 240 under the PMD layer 241. The PMD liner 240 can comprise SiN. The PMD layer 240 may be formed by a tetraethoxysilane (TEOS)-based silicon oxide deposition process. Step 106 comprises forming contacts, generally being tungsten filled, with as shown in FIG. 2F contacts 242a through the PMD layer 241 and the PMD liner 240 to contact the top plate 225, contacts 242b through the PMD layer 241 and PMD liner 240 to contact the bottom plate 213/212 by contacting its silicide layer 213, and contacts 242c through the PMD layer 241 and PMD liner 240 to contact nodes in the functional circuitry 180.

Figure 2G:
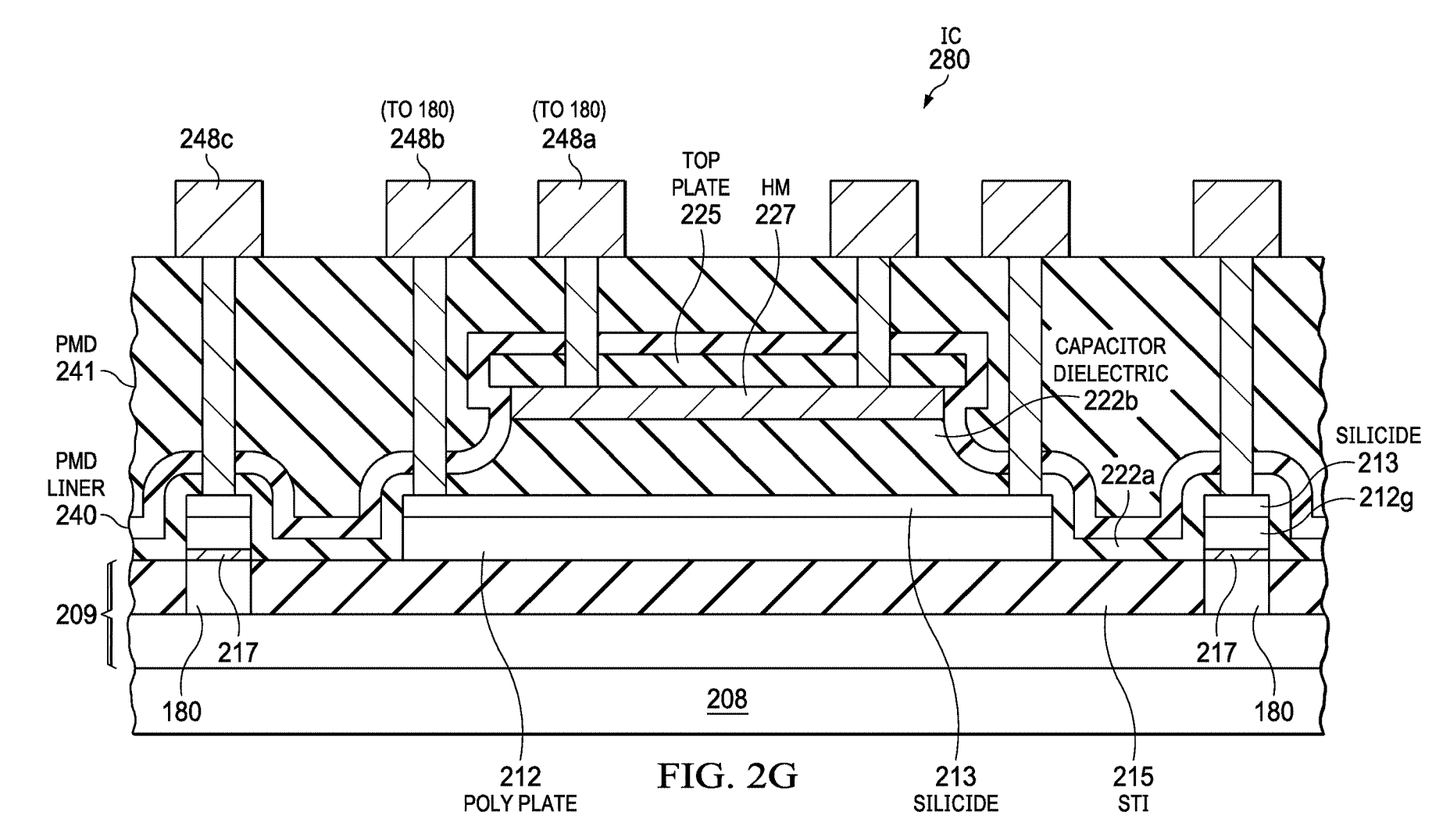

FIG. 2G shows results shown as IC 280 after forming a patterned metal 1 (M1) layer including metal contacts 248a, 248b and 248c to the contacts 242a, 242b, and 242c. The M1 layer including the metal contact can comprise aluminum, aluminum copper, or copper. Over the metal contacts 248a and 248b is shown "to 180" that indicates their being connected to respective nodes within the functional circuitry 180. The HM layer 227 can comprise up to 50 nm of SiN, or up to 120 nm of silicon oxide.

The wafer processing for the IC 280 can then be completed by BEOL processing comprising forming one or more additional metal levels thereon including a top metal level. The top metal layer can comprise aluminum (or an aluminum alloy) or copper. Passivation overcoat (PO) then generally follows, followed by patterning the PO to expose the bond pads. The PO layer comprises at least one dielectric layer such as silicon oxide, silicon nitride, or SiON.

Examples

Disclosed examples are further illustrated by the following specific Examples, which should not be construed as limiting the scope or content of this Disclosure in any way. The capacitor dielectric for the metal-to-polysilicon capacitor for all these Examples comprised an ONO dielectric stack 322 including a top silicon oxide layer 322c up to 15 nm thick, a middle SiN layer 222b up to 40 nm thick, and bottom silicon oxide layer 322a up to 15 nm thick.

Figure 3:
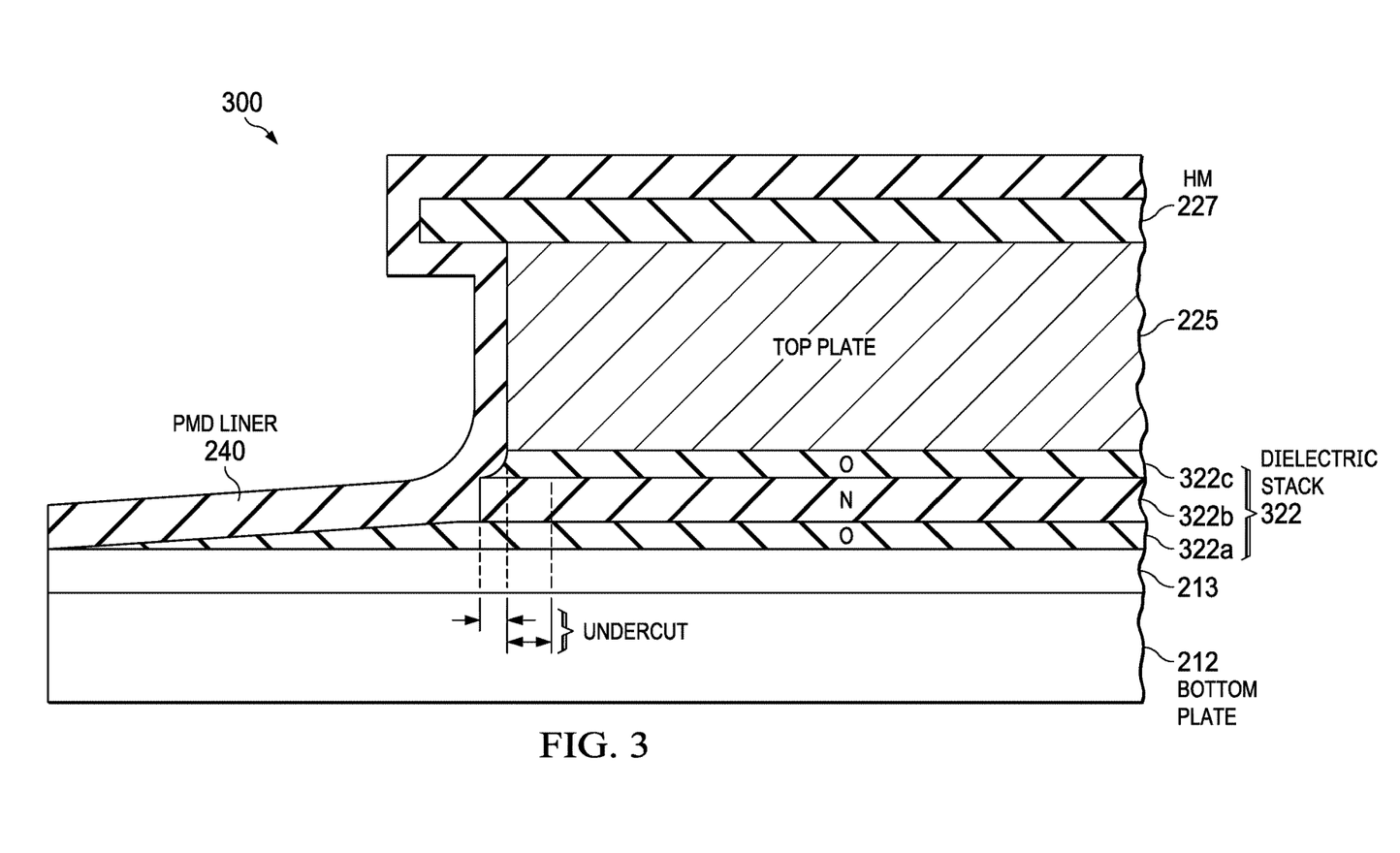
FIG. 3 is a depiction based on a transmission electron microscope (TEM) image of an example metal-to-polysilicon capacitor having a HM layer thereon that shows the sidewalls of the capacitor evidencing undercutting of at least a portion of the capacitor dielectric relative to the HM layer.

FIG. 3 is a depiction based on a TEM image of an example metal-to-polysilicon capacitor 300. The metal-to-polysilicon capacitor 300 is shown as a stack comprising a PMD liner 240, a HM layer 227, a top plate 225, an ONO dielectric stack 322, and a bottom plate 213/212 after a disclosed capacitor dielectric etch comprising a plasma etch with 150 W for 28 sec using $BCl_3$ and $Cl_2$, then a wet etch comprising a dilute HF etch at room temperature for etching about 4 nm of silicon oxide. FIG. 3 shows the sidewalls of the top silicon oxide layer 322c and to a lesser degree the middle SiN layer 222b (due to a slower etch HF etch rate of SiN relative to silicon oxide) undercut relative to the HM layer 227. Regarding the undercuts, the top silicon oxide layer 322c tapers from the edge of the top plate 225. The SiN layer 222b extends about half way under the HM layer 227 that provides an overhang, and the bottom silicon oxide layer 322a starts tapering at about the edge of the overhang. As used herein the capacitor dielectric being undercut refers to a recess in at least a portion of the thickness of the capacitor dielectric relative to the HM layer 227 of at least about 3 nm, that is typically in a range between about 4 nm and about 8 nm.

The Metal 2 field threshold voltage recovery post-capacitor dielectric layer etch versus a baseline process flow with no capacitor was measured. The capacitor dielectric etch again comprised a plasma etch with 150 W for 28 sec using $BCl_3$ and $Cl_2$ as the etch gases, and the wet etch comprised a dilute HF etch at room temperature for etching about 4 nm of silicon oxide. When highly charged SiO and SiN films are left on the wafer, they tend to lower the parasitic field threshold voltage (Field $V_T$) created at well boundaries. Etching away these films recovers these $V_T$ values greater than 90% back to the values prior to having the ONO stack deposited on the wafer. CMOS noise was also found to recover post etch.

The metal-to-polysilicon capacitor breakdown voltage was also measured as a function of the dry and wet etch. No outliers were noted with the disclosed plasma etch then wet etch for etching the capacitor dielectric layer. Other data obtained showed no measurable impact by the capacitor dielectric etch on the contact resistance to the silicide on the n or p-doped polysilicon. The capacitor's breakdown which can be lowered by undercuts of the capacitor dielectric relative to the top plate, as shown in FIG. 3 does not result when employing a disclosed dry then wet etch combination for the dielectric layer etch. Contact resistance to silicide on polysilicon can also be impacted post etch for a conventional dry only capacitor dielectric layer etch.

The capacitor voltage coefficients (VCC) was also measured as a function of the dry and wet etch. VCC is one of the most important criteria for precision capacitors which represent the change in capacitance for a change in voltage across the capacitor. The VCCs were found to not be noticeably changed by the disclosed plasma etch followed by wet etch of the capacitor dielectric stack. Voltage coefficients were found to also remain similar to the case where the dielectric is not etched indicating that the performance of a disclosed metal-to-polysilicon capacitor is not measurably impacted by a disclosed plasma etch then wet etch of the capacitor dielectric stack.

This Disclosure can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other examples are possible within the scope of the claimed invention, and further additions, deletions, substitutions and modifications may be made to the described examples without departing from the scope of this Disclosure.

The invention claimed is:

1. A method of fabricating a metal-to-polysilicon capacitor on an integrated circuit (IC), comprising:
    forming a bottom plate comprising polysilicon on a dielectric layer on a semiconductor surface layer of a substrate;
    depositing at least one capacitor dielectric layer over the bottom plate and over regions of the semiconductor surface layer laterally adjacent the bottom plate;
    forming a top plate layer on the capacitor dielectric layer;
    patterning the top plate layer and the capacitor dielectric layer to form a top plate and a capacitor dielectric including removing a portion of the capacitor dielectric layer from the lateral regions, wherein the removing comprises at least one dry etch followed by at least one wet etch;
    depositing a pre-metal dielectric (PMD) layer, and
    forming contacts through the PMD layer including a contact that contacts the top plate and a contact that contacts the bottom plate.

2. The method of claim 1, wherein the lateral regions include functional circuitry comprising circuit elements configured together with the metal-to-polysilicon capacitor for realizing at least one circuit function.

3. The method of claim 1, wherein the portion of the capacitor dielectric layer removed in the removing is in a range between about 50% and about 95% of an as-deposited thickness of the capacitor dielectric layer.

4. The method of claim 1, wherein the capacitor dielectric layer comprises a dielectric stack comprising a first silicon oxide layer, a middle silicon nitride or silicon oxynitride layer, and a second silicon oxide layer, and wherein the depositing the silicon nitride or silicon oxynitride layer comprises low pressure chemical vapor deposition (LPCVD) or plasma enhanced CVD (PECVD).

5. The method of claim 4, wherein a thickness of the dielectric stack is in a range between about 20 nm and about 200 nm.

6. The method of claim 1, further comprising forming a silicided layer on a top surface of the polysilicon before the depositing of the capacitor dielectric layer.

7. The method of claim 1, wherein the wet etch comprises using a hydrofluoric acid solution.

8. The method of claim 1, further comprising forming a hard mask layer on the top plate layer before the patterning of the top plate layer and the capacitor dielectric layer.

9. The method of claim 1, wherein the top plate comprises TaN, TiN, Ni, Pt, Co, CoSi, or Ir.

10. The method of claim 1, wherein the dielectric layer on the semiconductor surface layer comprises shallow trench isolation (STI) or LOCal Oxidation of Silicon (LOCOS).

11. An integrated circuit (IC), comprising:
    a semiconductor surface layer on a substrate;
    a metal-to-polysilicon capacitor on a dielectric layer on the semiconductor surface layer, comprising:
    a bottom plate comprising polysilicon;
    at least one capacitor dielectric comprising a capacitor dielectric layer over the bottom plate;
    a top plate over the capacitor dielectric,
    a hard mask (HM) layer on the top plate, the capacitor dielectric layer having an undercut with respect to the HM layer, and
    contacts through a pre-metal dielectric layer including a contact that contacts the top plate and a contact that contacts the bottom plate,
    wherein in lateral regions on the semiconductor surface layer the capacitor dielectric layer has a thickness in a range between about 5% and about 50% of the thickness of the capacitor dielectric for the metal-to-polysilicon capacitor.

12. The IC of claim 11, wherein at least a portion of an outer edge of the capacitor dielectric is undercut at least about 3 nm relative to an outer edge of the HM layer.

13. The IC of claim 12, wherein the undercut has a depth in a range between about 4 nm and about 8 nm.

14. The IC of claim 11, wherein the lateral regions include functional circuitry comprising circuit elements configured together with the metal-to-polysilicon capacitor for realizing at least one circuit function.

15. The IC of claim 11, wherein the capacitor dielectric comprises a dielectric stack comprises a first silicon oxide layer, a middle silicon nitride or silicon oxynitride layer, and a second silicon oxide layer.

16. The IC of claim 15, wherein a thickness of the dielectric stack is m a range between about 200 A and about 200 nm.

17. The IC of claim 11, further comprising a silicide layer on a top surface of the polysilicon.

18. The IC of claim 11, wherein the dielectric layer over the semiconductor surface layer comprises a shallow trench isolation (STI) or LOCal Oxidation of Silicon (LOCOS) structure.

19. The IC of claim 11, wherein the top plate comprises TaN, TiN, Ni, Pt, Co, CoSi, or Ir.

20. An integrated circuit (IC), comprising: a semiconductor surface layer on a substrate;
    a metal-to-polysilicon capacitor over a dielectric layer on the semiconductor surface layer, comprising:
    a bottom plate comprising polysilicon;
    a capacitor dielectric comprising at least one capacitor dielectric layer over the bottom plate;
    a top plate over the capacitor dielectric,
    a hard mask (HM) layer over the top plate, and
    contacts through a pre-metal dielectric layer including a contact that contacts the top plate and a contact that contacts the bottom plate,
    wherein in lateral regions on the semiconductor surface layer the capacitor dielectric layer has a thickness in a range between about 5% and about 50% of the thickness of the capacitor dielectric, and wherein at least a portion of an outer edge of the capacitor dielectric is undercut is at least about 3 nm relative to an outer edge of the HM layer.

* * * * *